United States Patent
Kazem et al.

(10) Patent No.: US 11,821,070 B2
(45) Date of Patent: Nov. 21, 2023

(54) RUTHENIUM FILM DEPOSITION USING LOW VALENT METAL PRECURSORS

(71) Applicant: Applied Materials, Inc., Santa Clara, CA (US)

(72) Inventors: Nasrin Kazem, Santa Clara, CA (US); Muthukumar Kaliappan, Fremont, CA (US); Jeffrey W. Anthis, San Jose, CA (US); Michael Haverty, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 416 days.

(21) Appl. No.: 17/095,444

(22) Filed: Nov. 11, 2020

(65) Prior Publication Data
US 2021/0140041 A1 May 13, 2021

Related U.S. Application Data

(60) Provisional application No. 62/933,765, filed on Nov. 11, 2019.

(51) Int. Cl.
| C23C 16/40 | (2006.01) |
| C23C 16/455 | (2006.01) |
| C23C 16/18 | (2006.01) |

(52) U.S. Cl.
CPC .............. *C23C 16/40* (2013.01); *C23C 16/18* (2013.01); *C23C 16/45534* (2013.01); *C23C 16/45553* (2013.01)

(58) Field of Classification Search
CPC ... C23C 16/40; C23C 16/18; C23C 16/45534; C23C 16/45553; C23C 16/06
See application file for complete search history.

(56) References Cited

U.S. PATENT DOCUMENTS

| 6,617,248 | B1 | 9/2003 | Yang |
| 6,824,816 | B2 | 11/2004 | Aaltonen et al. |
| 7,265,048 | B2 | 9/2007 | Chung et al. |
| 7,632,351 | B2 | 12/2009 | Thompson |
| 2003/0045094 | A1 | 3/2003 | Itatani et al. |
| 2004/0092096 | A1 | 5/2004 | Raaijmakers et al. |
| 2009/0199739 | A1* | 8/2009 | Thompson ............... C09D 1/00 106/287.18 |
| 2014/0170328 | A1 | 6/2014 | Boyd et al. |
| 2019/0115255 | A1 | 4/2019 | Kazem et al. |
| 2020/0262854 | A1* | 8/2020 | Yoshino ................. H01L 21/28 |

OTHER PUBLICATIONS

Sciencenotes (https://sciencenotes.org/list-of-electronegativity-values-of-the-elements/ online May 9, 2015) (Year: 2015).*
EIC chemical search (Year: 2021).*

* cited by examiner

*Primary Examiner* — Michael G Miller
(74) *Attorney, Agent, or Firm* — Servilla Whitney LLC

(57) ABSTRACT

Methods of depositing metal films comprising exposing a substrate surface to a first metal precursor followed by a non-oxygen containing reducing agent comprising a second metal to form a zero-valent first metal film are described. The reducing agent has a metal center that is more electropositive than the metal center of the first metal precursor. In some embodiments, methods of depositing ruthenium films are described in which a substrate surface is exposed to a ruthenium precursor to form a ruthenium containing film on the substrate surface followed by exposure to a non-oxygen containing reducing agent to reduce the ruthenium containing film to a zero-valent ruthenium film and generate an oxidized form of the reducing agent.

16 Claims, No Drawings

RUTHENIUM FILM DEPOSITION USING LOW VALENT METAL PRECURSORS

CROSS-REFERENCE TO RELATED APPLICATIONS

This application claims priority to U.S. Provisional Application No. 62/933,765, filed Nov. 11, 2019, the entire disclosure of which is hereby incorporated by reference herein.

TECHNICAL FIELD

Embodiments of the present disclosure generally relate to methods of depositing thin film. In particular, embodiments of the disclosure are directed to methods for depositing ruthenium films.

BACKGROUND

Ruthenium (Ru) seems to be the best candidate so far to afford the demand for reduction in the contact size while maintaining low resistance as well as being a promising candidate for being used as electrodes in memory applications due to both its low resistivity and high work function. However, perfect filling in the gap structures with no void and seam remains challenging, particularly in advance nodes <7 nm where the void and seam sizes become comparable with the feature sizes.

By taking advantage of the inherent self-limited growth mechanism, atomic layer deposition (ALD) becomes a reliable method to grow conformal films with sub-nm thickness control. However, there are not many Ru ALD processes in the literature that can be carried out under non-oxidative conditions. Ru precursors typically show either no or low reactivity toward nonoxidative common reactants such as $NH_3$ and $H_2$ making them prohibitively practical for industrial processes.

Accordingly, there is a need for improved ruthenium precursors and improved methods of depositing ruthenium films.

SUMMARY

One or more embodiments of the disclosure are directed to methods of depositing ruthenium films. A substrate surface is exposed to a ruthenium precursor to form a self-limiting ruthenium containing film on the substrate surface with Ru(I) and/or Ru(II) species on the surface.

The substrate surface is exposed to a non-oxygen containing reducing agent to reduce the ruthenium containing film to zero-valent ruthenium and generate an oxidized form of the reducing agent.

Additional embodiments of the disclosure are directed to methods of depositing ruthenium films. A substrate surface is exposed to a ruthenium precursor comprising $Ru(amd)_2(CO)_2$, where amd is N-tert-butyl-N'-ethyl-2-methylamidinate, to form a ruthenium containing film on the substrate surface. The substrate surface is then exposed to a non-oxygen containing reducing agent to reduce the ruthenium containing film to zero-valent ruthenium and generate a volatile oxidized form of the reducing agent. The reducing agent comprises a low valence metal complex having a metal center with an oxidation state less than or equal to 2+.

Further embodiments of the disclosure are directed to methods of depositing a metal film. A substrate surface is exposed to a first metal precursor to form a first metal containing film on the substrate surface. The substrate surface is then exposed to a non-oxygen containing reducing agent comprising a second metal to reduce the first metal containing film to a zero-valent first metal and generate an oxidized form of the reducing agent. The second metal has a more electropositive metal center than the first metal precursor.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

"Atomic layer deposition" or "cyclical deposition", as used herein, refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. aluminum precursor) is pulsed into the reaction zone followed by a first time delay. Next, a second precursor or compound B (e.g. oxidant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

One or more embodiments of the disclosure are directed to methods of depositing metal films. A substrate surface is exposed to a first metal precursor to form a first metal containing film on the substrate surface. The substrate surface is then exposed to a non-oxygen containing reducing agent comprising a second metal to reduce the first metal containing film to a zero-valent first metal and generate an oxidized form of the reducing agent. In some embodiments, the second metal has a more electropositive metal center than the first metal precursor.

In some embodiments, the first metal comprises ruthenium. Some embodiments of the disclosure advantageously provide one or more method to deposit a ruthenium (Ru) film by atomic layer deposition (ALD). Some embodiments of the disclosure advantageously use non-oxygen based reactants. In some embodiments, the non-oxygen based reactant comprises a second metal. The second metal of some embodiments comprises one or more of ruthenium (Ru), copper (Cu), tin (Sn), molybdenum (Mo), chromium (Cr), nickel (Ni) or iron (Fe).

Some embodiments of the disclosure are directed to methods of depositing a ruthenium film. A substrate surface is exposed to a ruthenium precursor to form a ruthenium containing film on the substrate surface. In some embodiments, the substrate surface is exposed to a ruthenium precursor to form a self-limiting ruthenium containing film on the substrate surface with Ru(I) and/or Ru(II) species on the surface. As used in this specification and the appended claims, the term "self-limiting" means that the reaction occurs until substantially all available active sites on the substrate surface have been reacted with. The skilled artisan will understand that some of the active sites may not be available due to, for example, steric hindrance from the surface species. In some embodiments, the self-limiting ruthenium containing film comprises Ru(I) and Ru(II) species.

The substrate surface is then exposed to a non-oxygen containing reducing agent to reduce the ruthenium containing film to zero-valent ruthenium and generate an oxidized form of the reducing agent.

In some embodiments, the ruthenium precursor comprises a ruthenium(II) metal center. In some embodiments, the ruthenium precursor comprises a compound having the general formula $Ru(amd)_2L_2$, where amd is an amidinate and L is a neutral ligand, as shown in structure (I). An "amidinate" as used herein refers to a bidentate ligand with an N(R)—C(R')—N(R") backbone. In some embodiments, each of R, R' and R" are independently selected from H and C1-C10 alkyl, alkenyl, alkynyl, cycloalkyl groups, heteroatom groups with a carbon to non-carbon atom (excluding hydrogen) bond. As used in this manner, a C followed by a numeral (e.g., C2) refers to an alkyl group with the number of carbon atoms specified by the numeral. For example, a C2 alkyl is an ethyl group. In some embodiments, the alkyl groups are straight chain or branched, substituted or unsubstituted.

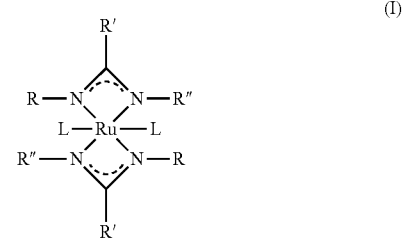

(I)

In some embodiments, R and R" are different substituents creating an asymmetrical ligand backbone. Without being bound by any particular theory of operation, it is believed that different R and R" groups increase the rotational entropy of the ligand and increase the reactivity. In some embodiments, each of R, R' and R" are different substituents. In some embodiments, each of R, R' and R" are C1-C6 alkyl groups. In some embodiments, R' and one or more of R or R" are connected to form a ring structure on the amidinate backbone.

In some embodiments, each L is independently a neutral ligand selected from carbonyl (CO), water ($H_2O$), neutral nitriles (e.g., acetonitrilo) neutral amines (e.g., ethylene diamine), neutral phosphines (e.g., triphenylphosphine), bipyridine. In some embodiments, $L_2$ refers to a single bidentate neutral ligand (e.g., ethylene diamine, bipyridine, phenantroline). In some embodiments, L comprises a halide.

In one or more embodiments of the disclosure, the ruthenium precursor comprises a compound with the formula $Ru(MEB-amd)_2(CO)_2$, where MEB-amd is N-tert-butyl-N'-ethyl-2-methylamidinate, shown as structure (II). The embodiment illustrated in structure (II) is structure (I) in which R is a tert-butyl group, R' is a methyl group and R" is an ethyl group, and each L is a carbonyl ligand.

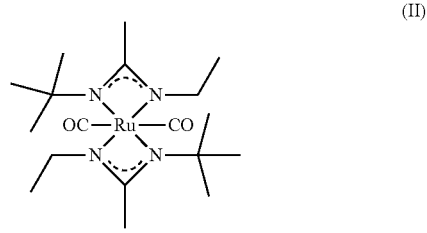

(II)

In some embodiments, the ruthenium precursor is homoleptic with respect to the amidinate ligands and homoleptic with respect to the neutral ligands. For example, the complex of structure (II) is homoleptic with respect to both the amidinate ligands and the carbonyl ligands. In some embodiments, the ruthenium precursor is heteroleptic with respect to one or more of the amidinate ligands or the neutral ligands. For example, a complex with two of the same amidinate ligands, a carbonyl and a pyridine ligand is considered homoleptic with respect to the amidinate ligands and heteroleptic with respect to the neutral ligands.

The ruthenium precursor of structure (II) is formally a Ru(II) or Ru$^{2+}$ precursor with which ALD Ru metal films can be deposited by using $O_2$ as the co-reactant. However, ruthenium amidinates generally show very little reactivity with $NH_3$ or $H_2$. Some embodiments of the disclosure advantageously provide non-oxygen containing reactants with low valent metal-base precursors in which the metal center thermodynamically reduces the Ru(II) to Ru(0). In some embodiments, the ruthenium precursor comprises a oxidized ruthenium species having a formal oxidation state of +1, +2 or +4.

In some embodiments, the reactant comprises a low-valent metal center. As used in this manner, the term "low-valent" means that the oxidation state of the metal center is less than or equal to 2+. Suitable metal centers include, but are not limited to, compounds having copper (Cu), tin (Sn), molybdenum (Mo), chromium (Cr), nickel (Ni) or iron (Fe) as a metal center. In some embodiments, the reactant comprises one or more of Cu(I), Sn(I), Mo(0), Cr(0), Ni(0), or Fe(0) metal species. In some embodiments, the reducing agent comprises one or more of copper, tin, molybdenum, chromium, nickel or iron as a metal center.

In some embodiments, the reducing agent comprises a compound with one or more ligand in common with the first metal precursor, or ruthenium precursor. In some embodiments, the reducing agent comprises a compound with a ligand having the same backbone as the first metal precursor, or the ruthenium precursor. In some embodiments, the reducing agent comprises a compound with an amidinate backbone.

In some embodiments, the reducing agent comprises a dimer. In some embodiments, the reducing agent comprises a copper dimer with at least one ligand having an amidinate backbone. In some embodiments, the reducing agent comprises a copper(I) amidinate complex. In one or more embodiments, the reducing agent comprises a compound having the formula $Cu_2(iPr-amd)_2$, where iPr-amd is bis(N,N'-isopropyl)amidinate, as shown in Structure (III).

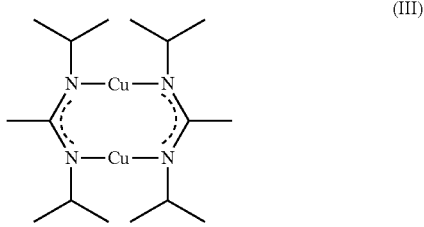

(III)

In some embodiments, the oxidized form of the reducing agent comprises a monomer. In some embodiments, the ruthenium precursor comprises $Ru(MEB-amd)_2(CO)_2$, where MEB-amd is N-tert-butyl-N'-ethyl-2-methylamidinate (See Structure (II)), the reducing agent comprises $Cu_2(iPr-amd)_2$, where iPr-amd is bis(N,N'-isopropyl)amidinate (See Structure (III)), and the oxidized form of the reducing agent comprises Cu(II)(amd)(iPr-amd), as shown in Structure (IV).

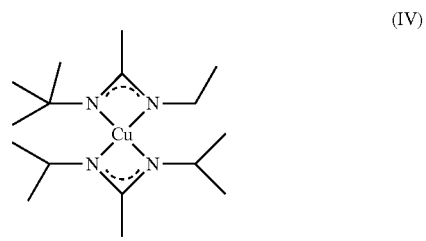

(IV)

In some embodiments, the oxidized form of the reducing agent is a volatile compound.

In some embodiments, the temperature of the substrate is controlled during deposition to be within the range of 150° C. to 550° C., or in the range of 200° C. to 500° C., or in the range of 250° C. to 450° C., or in the range of 300° C. to 400° C.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of depositing a ruthenium film, the method comprising:
   exposing a substrate surface to a ruthenium precursor to form a self-limiting ruthenium containing film on the substrate surface with Ru(I) and Ru(II) species on the surface; and
   exposing the substrate surface to a non-oxygen containing reducing agent to reduce the ruthenium containing film to zero-valent ruthenium and generate an oxidized form of the reducing agent, wherein the reducing agent comprises a low valence metal complex having a metal center with an oxidation state less than or equal to 2+ and the reducing agent comprises a dimer.

2. The method of claim 1, wherein the ruthenium precursor comprises a ruthenium(II) metal center.

3. The method of claim 2, wherein the ruthenium precursor comprises $Ru(amd)_2(CO)_2$, where amd is N-tert-butyl-N'-ethyl-2-methylamidinate.

4. The method of claim 1, wherein the reducing agent comprises one or more of copper, tin, molybdenum, chromium, nickel or iron as a metal center.

5. The method of claim 1, wherein the oxidized form of the reducing agent comprises one or more ligand from the ruthenium precursor.

6. The method of claim 1, wherein the oxidized form of the reducing agent comprises a monomer.

7. The method of claim 6, wherein the reducing agent comprises a copper dimer with at least one ligand having an amidinate backbone.

8. The method of claim 7, wherein the reducing agent comprises a copper(I) amidinate complex.

9. The method of claim 6, wherein the copper(I) amidinate complex comprises $Cu_2(iPr\text{-}amd)_2$, where iPr-amd is bis (N,N'-isopropyl)amidinate.

10. The method of claim 9, wherein the ruthenium precursor comprises $Ru(amd)_2(CO)_2$, where amd is N-tert-butyl-N'-ethyl-2-methylamidinate and the oxidized form of the reducing agent comprises Cu(II)(amd)(iPr-amd).

11. The method of claim 1, wherein the oxidized form of the reducing agent is volatile.

12. A method of depositing a ruthenium film, the method comprising:

exposing a substrate surface to a ruthenium precursor comprising $Ru(amd)_2(CO)_2$, where amd is N-tert-butyl-N'-ethyl-2-methylamidinate, to form a ruthenium containing film on the substrate surface; and exposing the substrate surface to a non-oxygen containing reducing agent to reduce the ruthenium containing film to zero-valent ruthenium and generate a volatile oxidized form of the reducing agent, the reducing agent comprising a low valence metal complex having a metal center with an oxidation state less than or equal to 2+, wherein the reducing agent comprises a dimer.

13. The method of claim 12, wherein the reducing agent comprises one or more of copper, tin, molybdenum, chromium, nickel or iron as a metal center.

14. The method of claim 12, wherein the oxidized form of the reducing agent comprises one or more ligand from the ruthenium precursor.

15. The method of claim 12, wherein the oxidized form of the reducing agent comprises a monomer.

16. The method of claim 15, wherein the reducing agent comprises $Cu_2(iPr\text{-}amd)_2$, where iPr-amd is bis (N,N'-isopropyl)amidinate, and the oxidized form of the reducing agent comprises Cu(II)(amd)(iPr-amd).

* * * * *

UNITED STATES PATENT AND TRADEMARK OFFICE
CERTIFICATE OF CORRECTION

PATENT NO. : 11,821,070 B2
APPLICATION NO. : 17/095444
DATED : November 21, 2023
INVENTOR(S) : Nasrin Kazem et al.

It is certified that error appears in the above-identified patent and that said Letters Patent is hereby corrected as shown below:

In the Claims

Column 7, Line 12, replace "claim 7" after "method of" and before "wherein" with "claim 1".

Signed and Sealed this
Sixth Day of February, 2024

*Katherine Kelly Vidal*

Katherine Kelly Vidal
*Director of the United States Patent and Trademark Office*